(12) United States Patent
Hsu

(10) Patent No.: US 9,253,901 B2
(45) Date of Patent: Feb. 2, 2016

(54) ELECTRONIC DEVICE WITH CABLE COLLECTING FUNCTION

(71) Applicant: HON HAI PRECISION INDUSTRY CO., LTD., New Taipei (TW)

(72) Inventor: Shih-Chang Hsu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 416 days.

(21) Appl. No.: 13/734,937

(22) Filed: Jan. 5, 2013

(65) Prior Publication Data

US 2013/0182398 A1    Jul. 18, 2013

(51) Int. Cl.
 *H05K 5/00* (2006.01)
 *H01R 13/72* (2006.01)
 *H01R 31/00* (2006.01)

(52) U.S. Cl.
 CPC .............. *H05K 5/0026* (2013.01); *H01R 13/72* (2013.01); *H01R 31/005* (2013.01)

(58) Field of Classification Search
 CPC ... H05K 5/0278; G06F 1/1675; G06F 1/1681; H01R 13/72; H01R 31/005; H01R 13/60; H01R 31/06; H01R 25/003; H01R 2201/06; H01R 35/04; H02G 11/02

USPC .......... 361/736, 752, 755, 756, 759; 439/501, 439/502, 4, 8
See application file for complete search history.

(56) References Cited

U.S. PATENT DOCUMENTS

| | | | |
|---|---|---|---|
| 6,433,274 B1* | 8/2002 | Doss et al. ...................... | 174/50 |
| 6,452,108 B1* | 9/2002 | Major .......................... | 174/135 |
| 8,157,569 B1* | 4/2012 | Liu ................................ | 439/11 |
| 2006/0043902 A1* | 3/2006 | Tsai et al. ...................... | 315/86 |
| 2008/0295275 A1* | 12/2008 | Yoo et al. ...................... | 15/300.1 |

* cited by examiner

*Primary Examiner* — Hoa C Nguyen
*Assistant Examiner* — Christopher L Augustin
(74) *Attorney, Agent, or Firm* — Novak Druce Connolly Bove + Quigg LLP

(57) ABSTRACT

An electronic device includes a main body including a printed circuit board (PCB) and a sliding portion, a seat portion slideably engaging with the sliding portion and a connecting cable including a first connector, a second connector and a cable portion connected between the first connector and the second connector. The seat portion includes a winding post and a through hole extending into the winding post and communicating to the main body. The winding post defines a gap communicating the through hole to periphery of the winding post. The first connector is inserted into the main body to engage with the PCB. The second connector is exposed outside of the seat portion. The cable portion is received in the through hole and the gap and enabled to be wound around the winding post.

17 Claims, 16 Drawing Sheets

ELECTRONIC DEVICE WITH CABLE COLLECTING FUNCTION

BACKGROUND

1. Technical Field

The present disclosure relates to an electronic device, and more particularly to the electronic device which can be adjusted to multiple angles and has a cable collecting function.

2. Description of Related Art

Generally, an electronic device with a Universal Serial BUS (USB) interface, for example, a wireless network card, a USB flash disk, a Moving Picture Experts Group Audio Layer III (MP3) player, or a Global Positioning System (GPS), connects with an electronic product (such as, a notebook personal computer) to transmit data and signals. How to design the electronic device which can conveniently connect with the electronic product at different adjustable angles is a question for discussion in the electronic industry.

Therefore, a need exists in the industry to overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
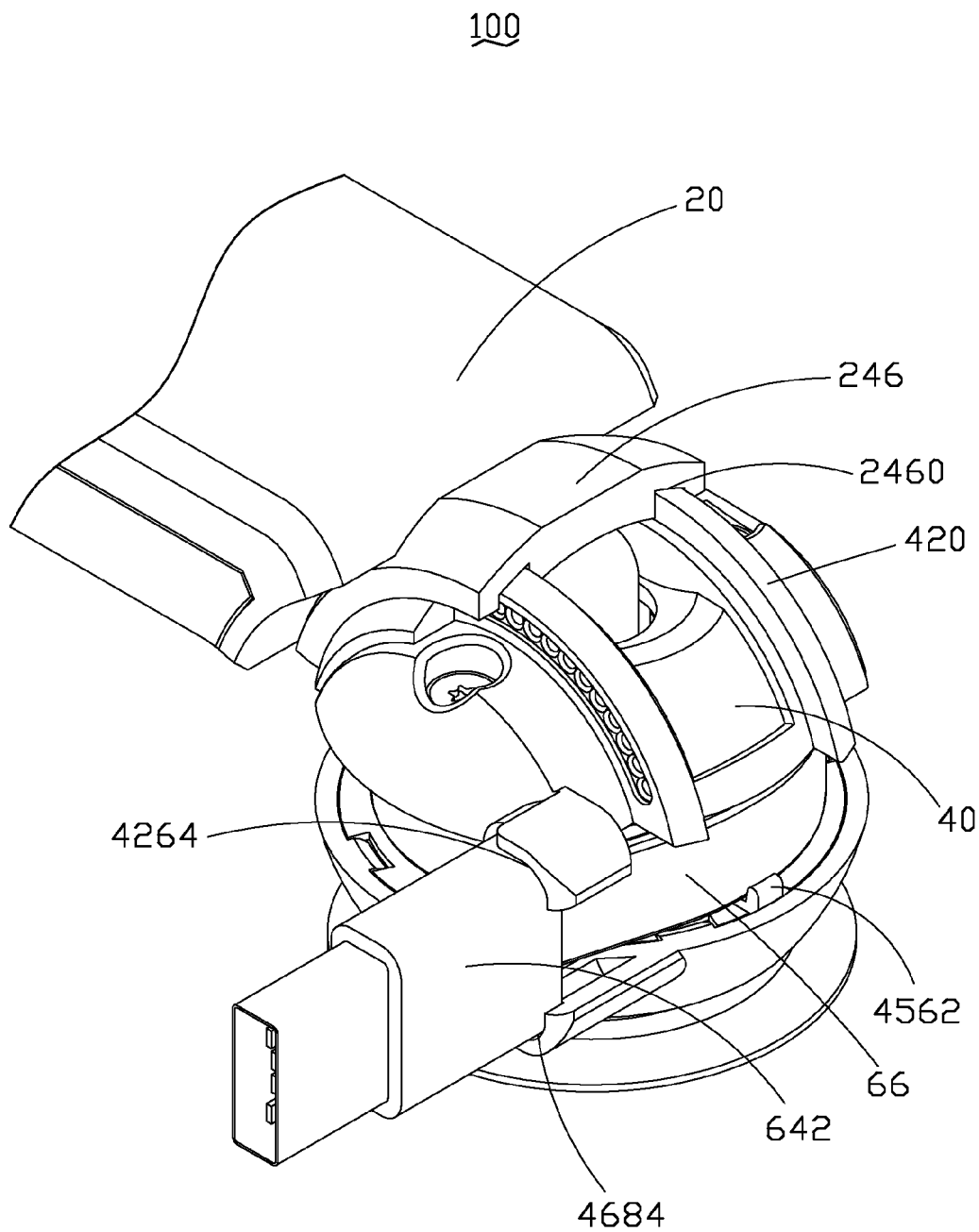
FIG. 1 is a perspective view of a first working condition of an electronic device in accordance with an exemplary embodiment of the disclosure, showing a main body engaging with a seat portion.
Figure 2:
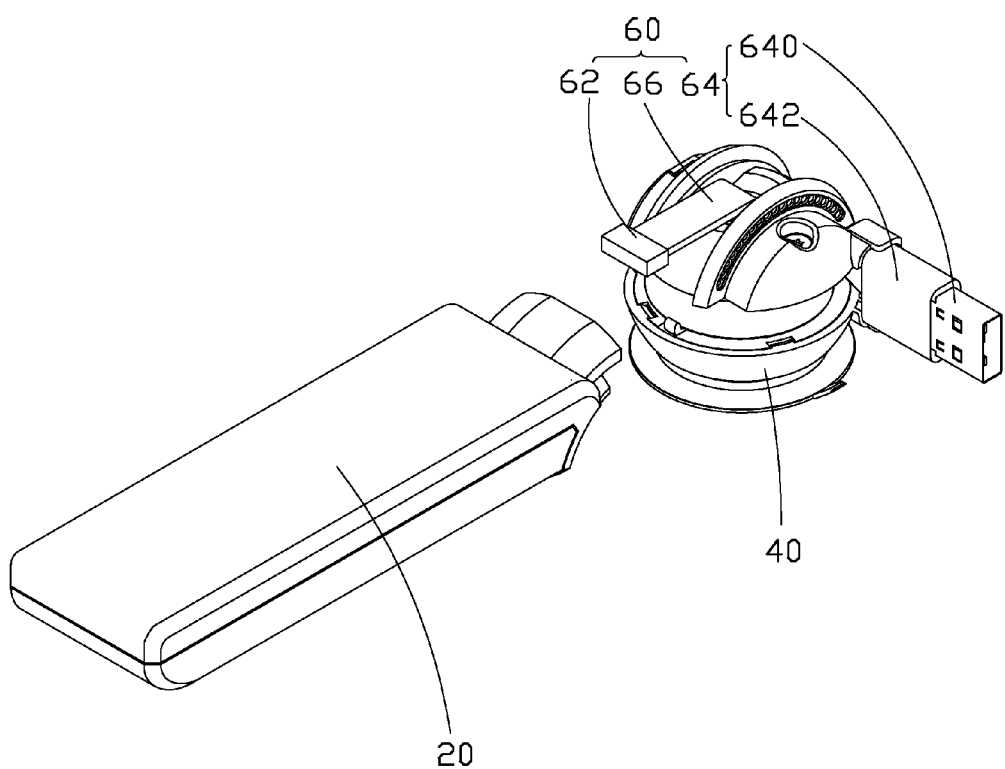
FIG. 2 is a disassembled perspective view of the electronic device in accordance with the exemplary embodiment of the disclosure.

In FIG. 1 and FIG. 2, an electronic device 100 comprises a main body 20, a seat portion 40, and a connecting cable 60. The main body 20 movably connects to the seat portion 40 placed on a placement surface (such as a desktop). The connecting cable 60 passes through the main body 20 and coils around the seat portion 40 to electrically connect the electronic device 100 to the peripheral equipment. A working angle of the main body 20 is adjusted by turning the seat portion 40 relative to the placement surface or by adjusting a relative angle between the main body 20 and the seat portion 40. In the illustrated embodiment, the electronic device 100 may be a wireless network card, a USB flash disk, a Moving Picture Experts Group Audio Layer III (MP3) player, or a Global Positioning System (GPS), the peripheral equipment maybe a notebook personal computer or a tablet personal computer, and the placement surface may be a desktop, a window surface, an enclosure of a communication equipment or a touch screen of the communication equipment.

Figure 3:
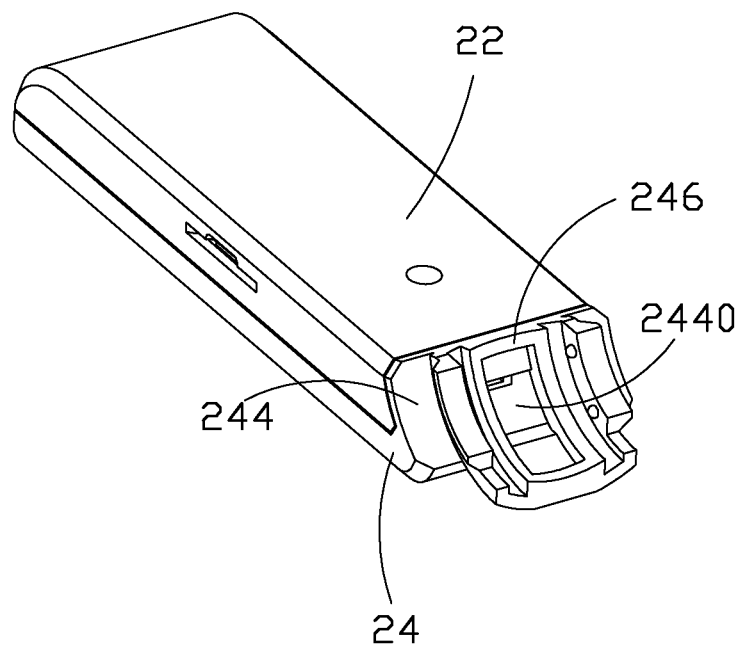
FIG. 3 is a perspective view of the main body of the electronic device in accordance with the exemplary embodiment of the disclosure.
Figure 4:
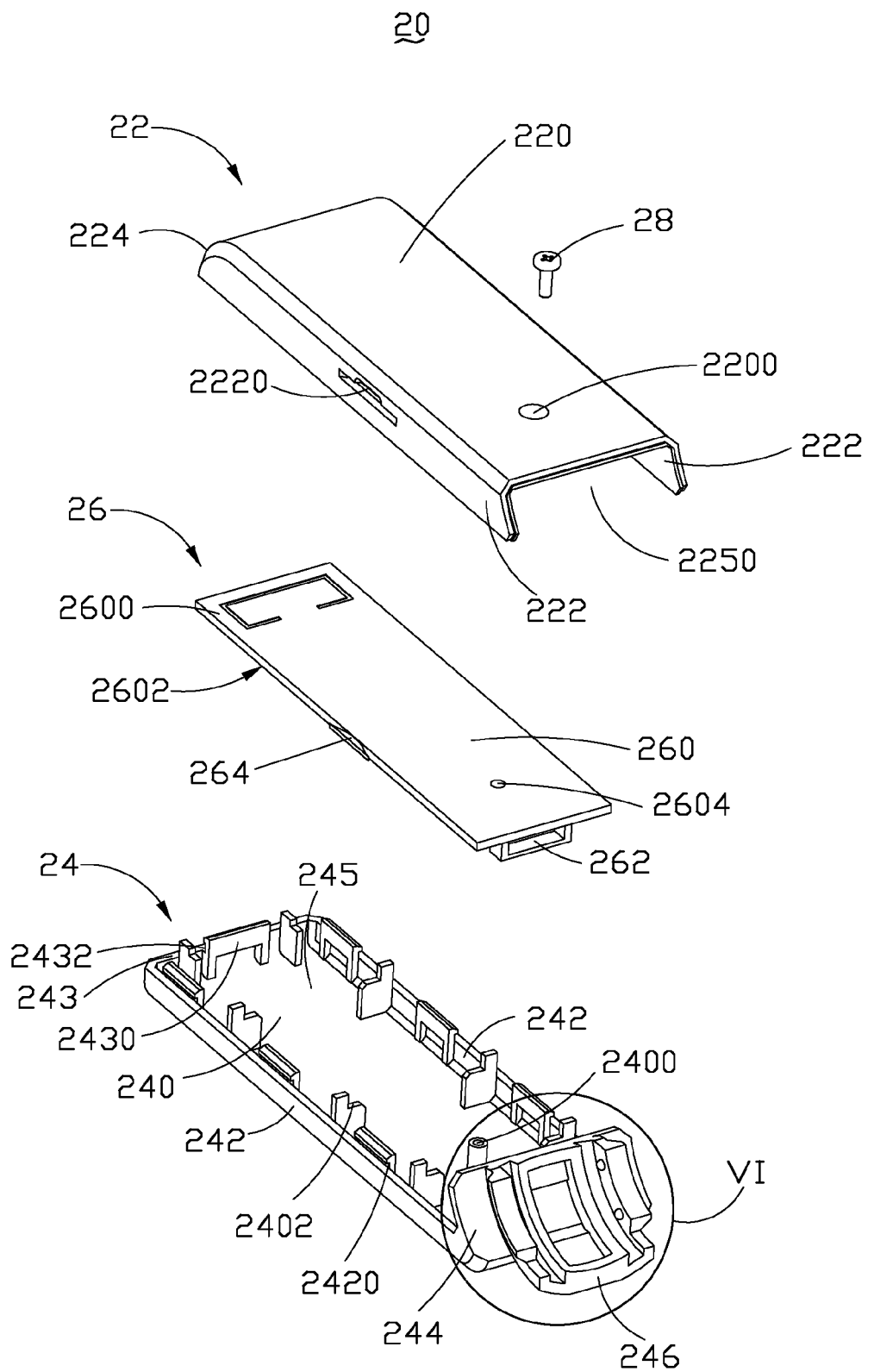
FIG. 4 is a disassembled perspective view of the main body in a first direction in accordance with the exemplary embodiment of the disclosure.
Figure 5:
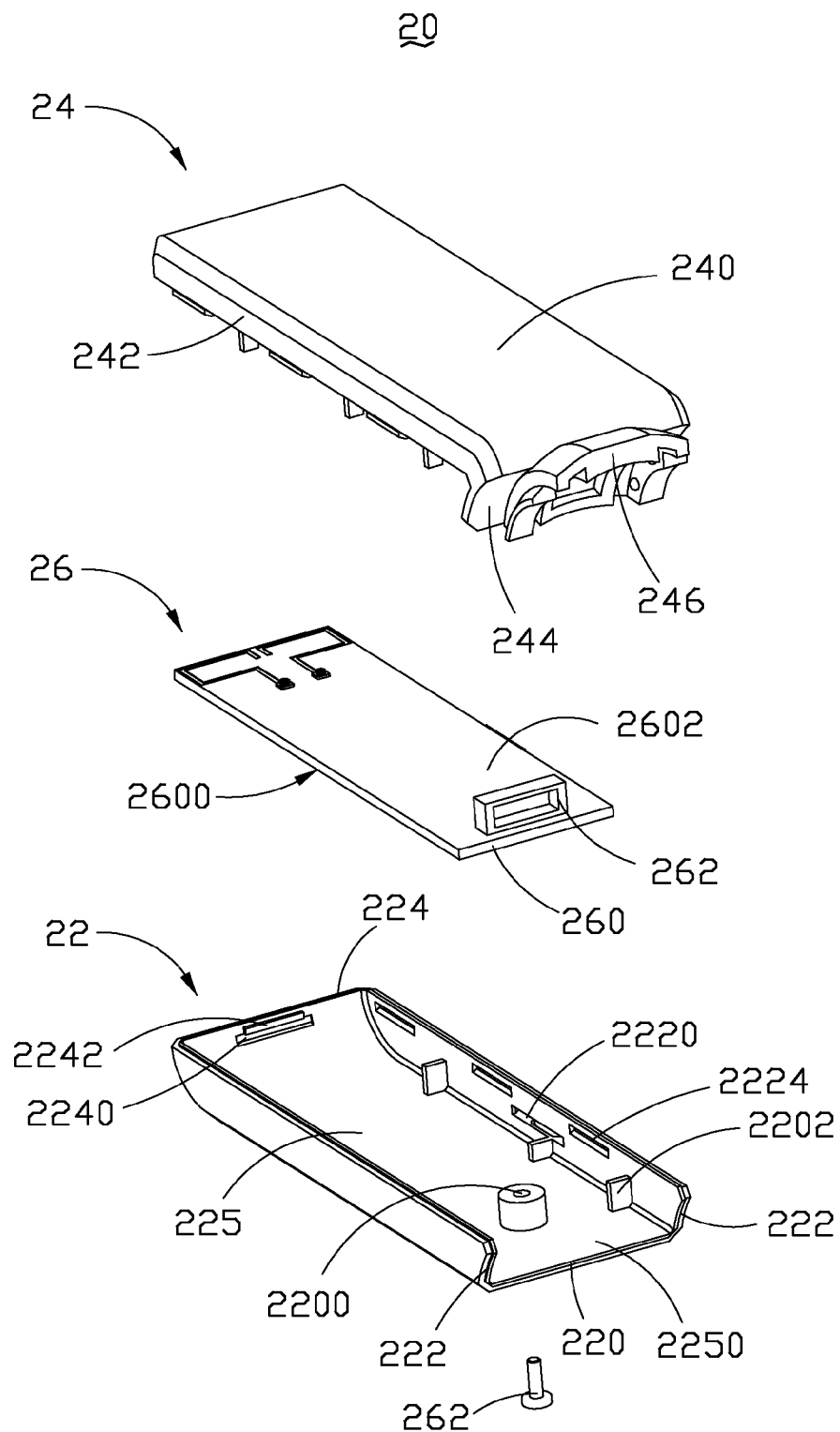
FIG. 5 is a disassembled perspective view of the main body in a second direction in accordance with the exemplary embodiment of the disclosure.

In to FIG. 3 to FIG. 5, the main body 20 comprises a front cover 22, a back cover 24, and a printed circuit board (PCB) 26 mounted between the front cover 22 and the back cover 24 and electrically connected with the connecting cable 60. The front cover 22 and the back cover 24 cooperatively form an integrated housing for receiving the PCB 26. The front cover 22 comprises a first lid board 220, a pair of first side boards 222 bending from two sides of the first lid board 220, and a first bottom portion 224 bending from the first lid board 220 and configured between the pair of first side boards 222. The first lid board 220, the pair of first side boards 222 and the first bottom portion 224 collectively form a first receiving housing 225 with a first opening 2250. The first lid board 220 comprises a plurality of first positioning blocks 2202 apart from each other, inwardly protruding from the first lid board 220 to the first receiving housing 225 and used to support the PCB 26.

The PCB 26 comprises a board portion 260 and a connecting port 262 protruding from the board portion 260 and located near one edge of the board portion 260. The board portion 260 comprises a first surface 2600 and a second surface 2602 opposite to the first surface 2600. The connecting port 262 protrudes from a second surface 2602 towards the back cover 24 to connect with the connecting cable 60.

The back cover 24 comprises a second lid board 240, a pair of second side boards 242 bending from two sides of the second lid board 240, and a second bottom portion 243 bending from the second lid board 240 and configured between the pair of second side boards 242. The second lid board 240, the pair of second side boards 242 and the second bottom portion 243 collectively form a second receiving housing 245. In assembly, the second lid board 240 is opposite to the first lid board 220 to make the first receiving housing 225 communicate with the second receiving housing 245 for receiving the PCB 26. The second lid board 240 comprises a plurality of second positioning blocks 2402 inwardly protruding from the second lid board 240 to the second receiving housing 245 to position the PCB 26. In the illustrated embodiment, an end of each of the plurality of second positioning blocks 2402 away from the second lid board 240 is configured in L-shaped to limit the PCB 26 in two directions.

The first side board 222 of the front cover 22 defines a plurality of first latching holes 2224, and the first bottom portion 224 defines a second latching hole 2240 and comprises a latching block 2242. The plurality of first latching holes 2224 and the second latching hole 2240 communicate with the first receiving housing 225. The latching block 2242 protrudes from the first bottom portion 224 towards the first receiving housing 225 and is configured on a side of the second latching hole 2240 away from the first lid board 220. A plurality of first latching hooks 2420 respectively opposite to the plurality of first latching holes 2224 extend from the second side boards 242 of the back cover 24. A second latching hook 2430 opposite to the second latching hole 2240 extends from the second bottom portion 243 of the back cover 24. The second latching hook 2430 defines a notch 2432 used to engage with the latching block 2242 in assembly.

In assembly, the board portion 260 of the PCB 26 is limited by the second position blocks 2402 and the first positioning blocks 2202. The connecting port 262 is received in the second receiving housing 245. The front cover 22 is fixed to the back cover 240 by engagements between the first latching hooks 2420 and the first latching holes 2224 and engagement between the second latching hook 2430 and the second latching hole 2240. When the second latching hook 2430 engages with the second latching hole 2240, the latching block 2240 is received in the notch 2432.

The first lid board 220 of the front cover 22 defines a first fixing hole 2200. The PCB 26 defines a second fixing hole 2604 passing through the first surface 2600 and the second surface 2602 and opposite to the first fixing hole 2200. The back cover 24 defines a third fixing hole 2400 opposite to the second fixing hole 2604. In assembly, a fixing screw 28 passes through the first fixing hole 2200 of the first cover 22 and the second fixing hole 2604 of the PCB 26 and is screwed into the third fixing hole 2400 to secure the PCB 26 between the front cover 22 and the back cover 24. The PCB 26 further comprises a second link port 264 facing one of the pair of first side boards 222, which defines a first link port 2220. The first link port 2220 acts as a passage for an exterior insert passing through and engaging with the second link port 264.

Figure 6:
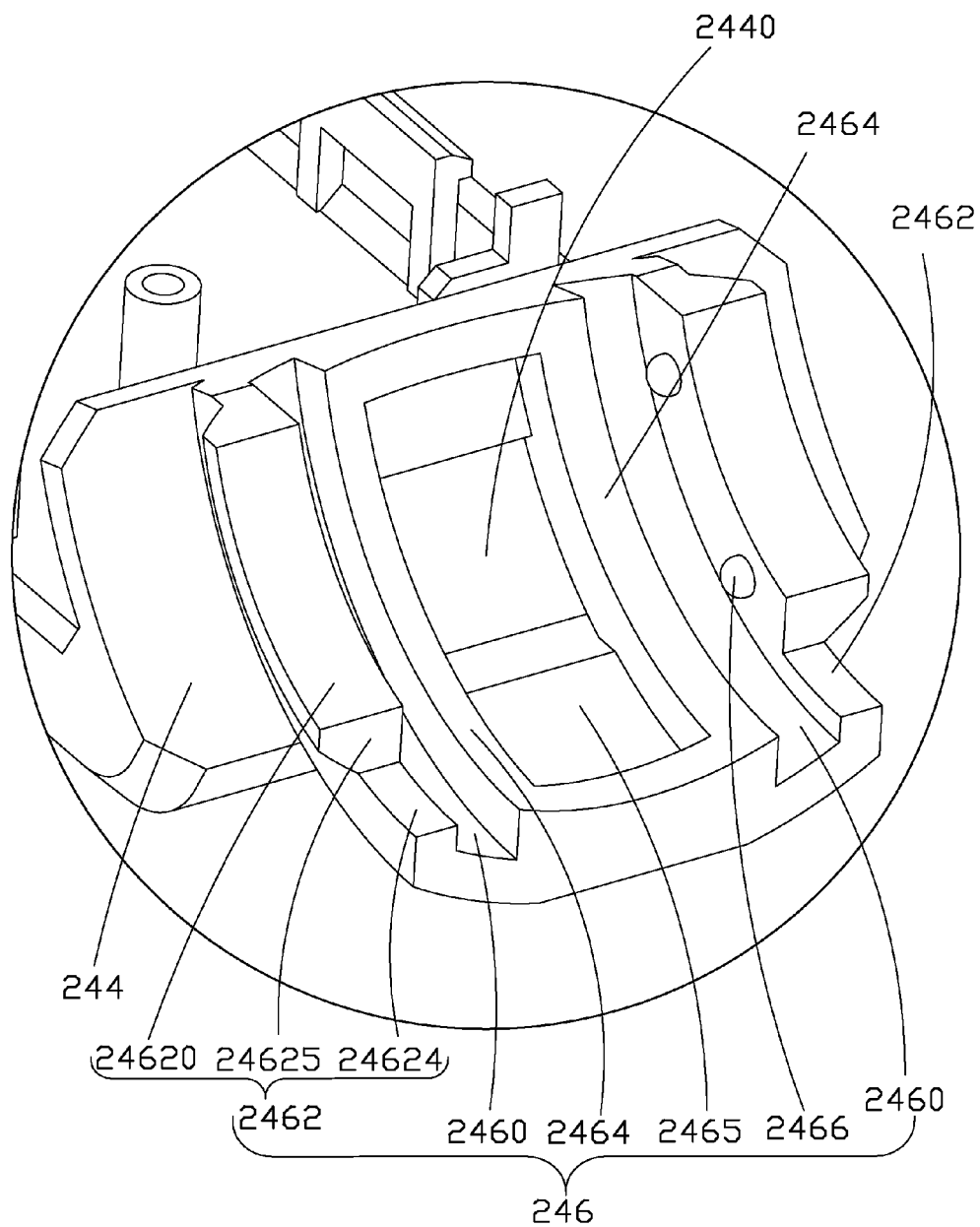
FIG. 6 is a partially enlarged perspective view of area labeled as VI shown in FIG. 4, showing a sliding portion of the main body.

Please referring to FIG. 6, the back cover 24 comprises a connecting board 244 configured between the second lid board 240 and the pair of second side boards 242 and opposite to the second bottom portion 243. The second lid board 240, the second bottom portion 243, the connecting board 244 and the pair of second side boards 242 cooperatively form the second receiving housing 245. A sliding portion 246 protrudes outwardly from the connecting board 244 away from the second receiving housing 245. The sliding portion 246 is used to slideably connect with the seat portion 40.

In this embodiment, the connecting board 244 has a curved surface and snugly contacts with ends of the pair of first side boards 222 and the first lid board 220. The connecting board 244 defines a connecting hole 2440 surrounded by the sliding portion 246 and communicating the second receiving housing 245 to an exterior of the main body 20. In assembly, connecting hole 2440 is opposite to the seat portion 40. The connecting cable 60 passes through the connecting hole 2440 from the exterior of the main body 20 to engage with the connecting port 262 of the PCB 26.

The sliding portion 246 defines a pair of sliding grooves 2460 and a receiving groove 2465 configured between the pair of sliding grooves 2460 and communicating with the connecting hole 2440. The pair of sliding grooves 2460 are arcuate shaped. The sliding portion 246 comprises two first side flanges 2462 respectively located two sides of the pair of sliding grooves 2460 and two second side flanges 2464 located between the pair of sliding grooves 2460. The receiving groove 2465 is formed between the two second side flanges 2464. Each of the sliding grooves 2460 is formed between one of the two first side flanges 2462 and a corresponding one of the second side flanges 2464. Each of the first side flanges 2462 comprises a first section 24620, a second section 24624 and a step portion 24625 connected between the first section 24620 and the second section 24624. The two first sections 24620 and the two second side flanges 2464 are cooperatively form an arcuate surface to contact with the seat portion 40. The sliding portion 246 further comprises a plurality of positioning protrusions 2466 protruding inwardly into the pair of sliding grooves 2460 to engage with the seat portion 40 and position the main body 20 to the seat portion 40 during rotating the main body 20 relative to the seat portion 40. In this embodiment, the positioning protrusions 2466 protrudes from the two first sections 24620 of the first side flanges 2462 and are spaced from each other.

Figure 7:
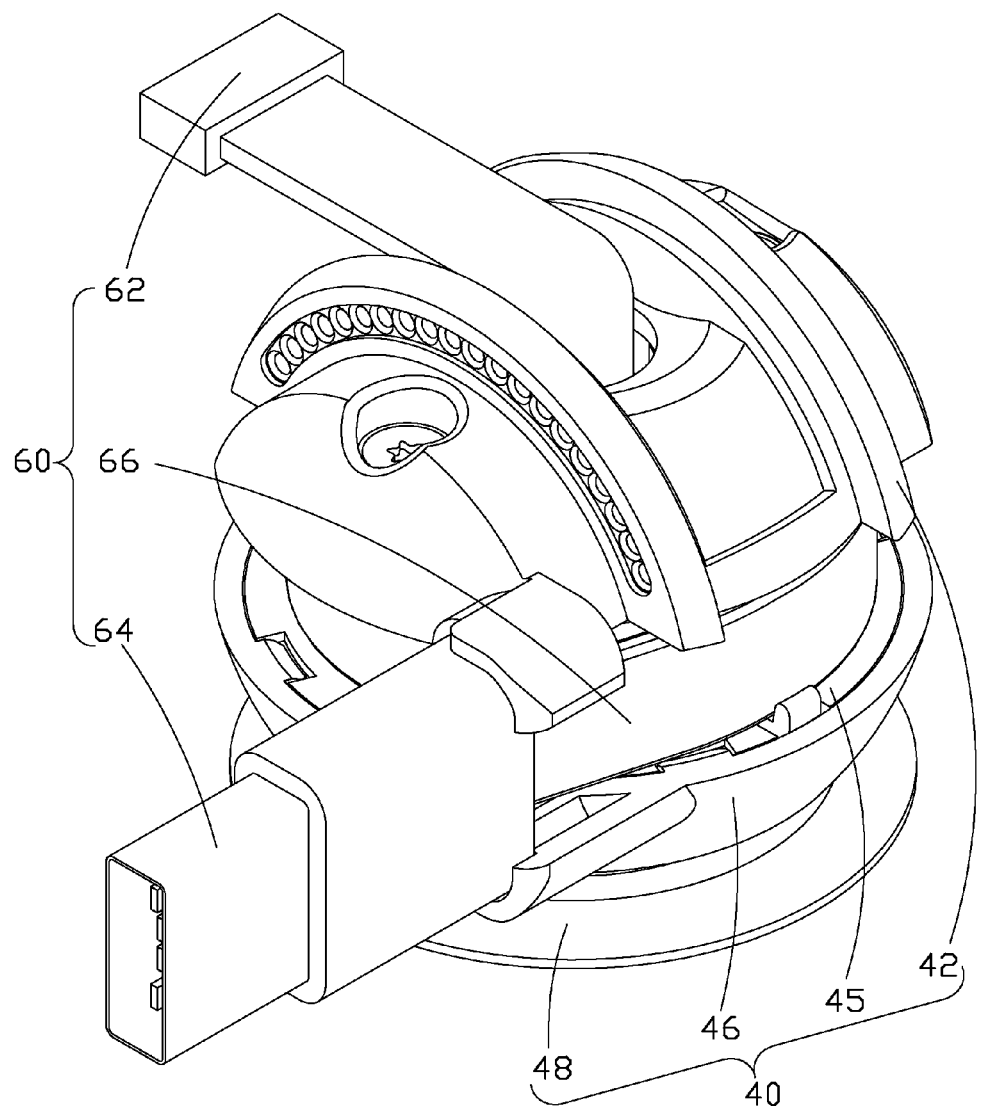
FIG. 7 is a perspective view of the seat portion of the electronic device in accordance with the exemplary embodiment of the disclosure.
Figure 8:
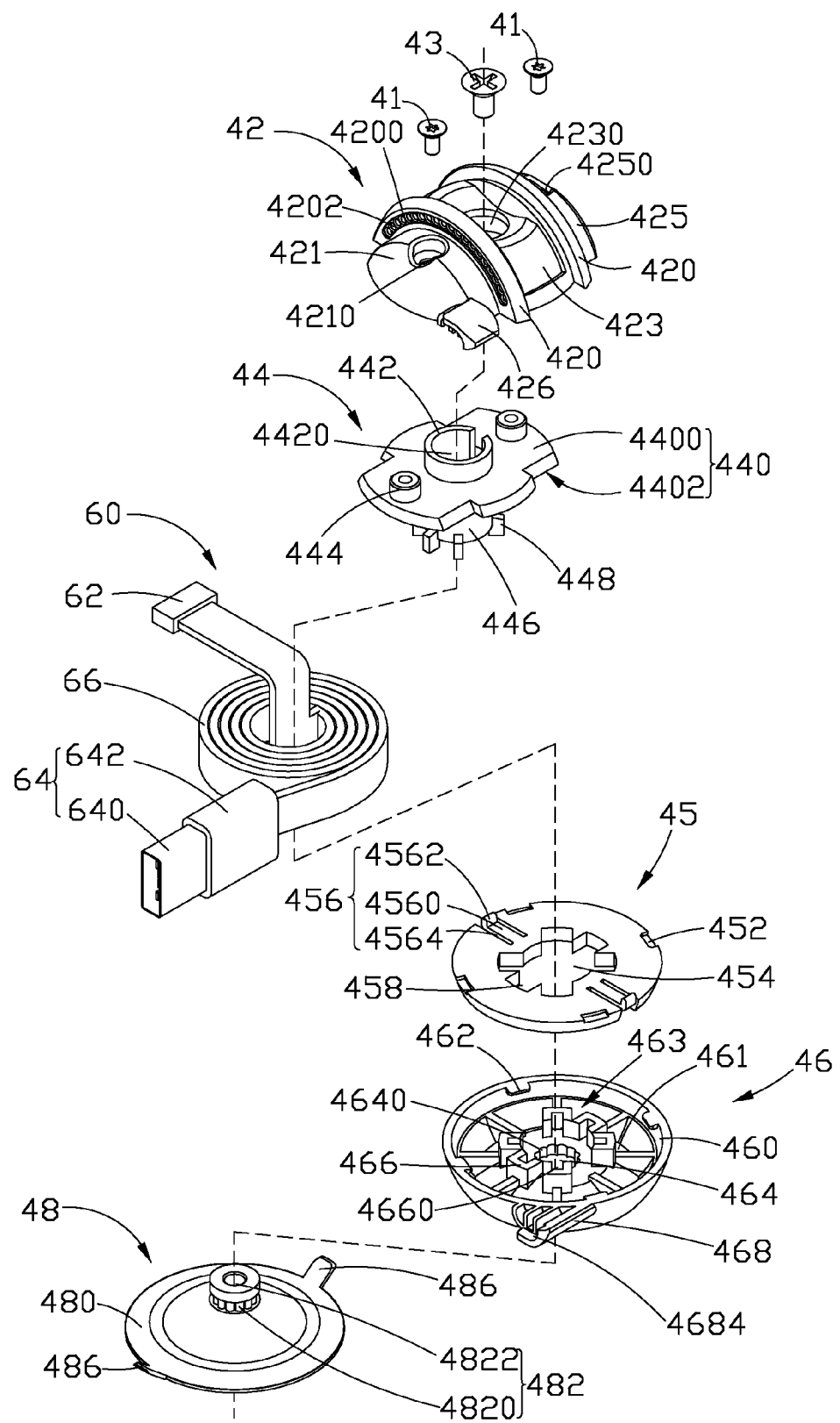
FIG. 8 is a disassembled perspective view of the seat portion in a first direction in accordance with the exemplary embodiment of the disclosure.
Figure 9:
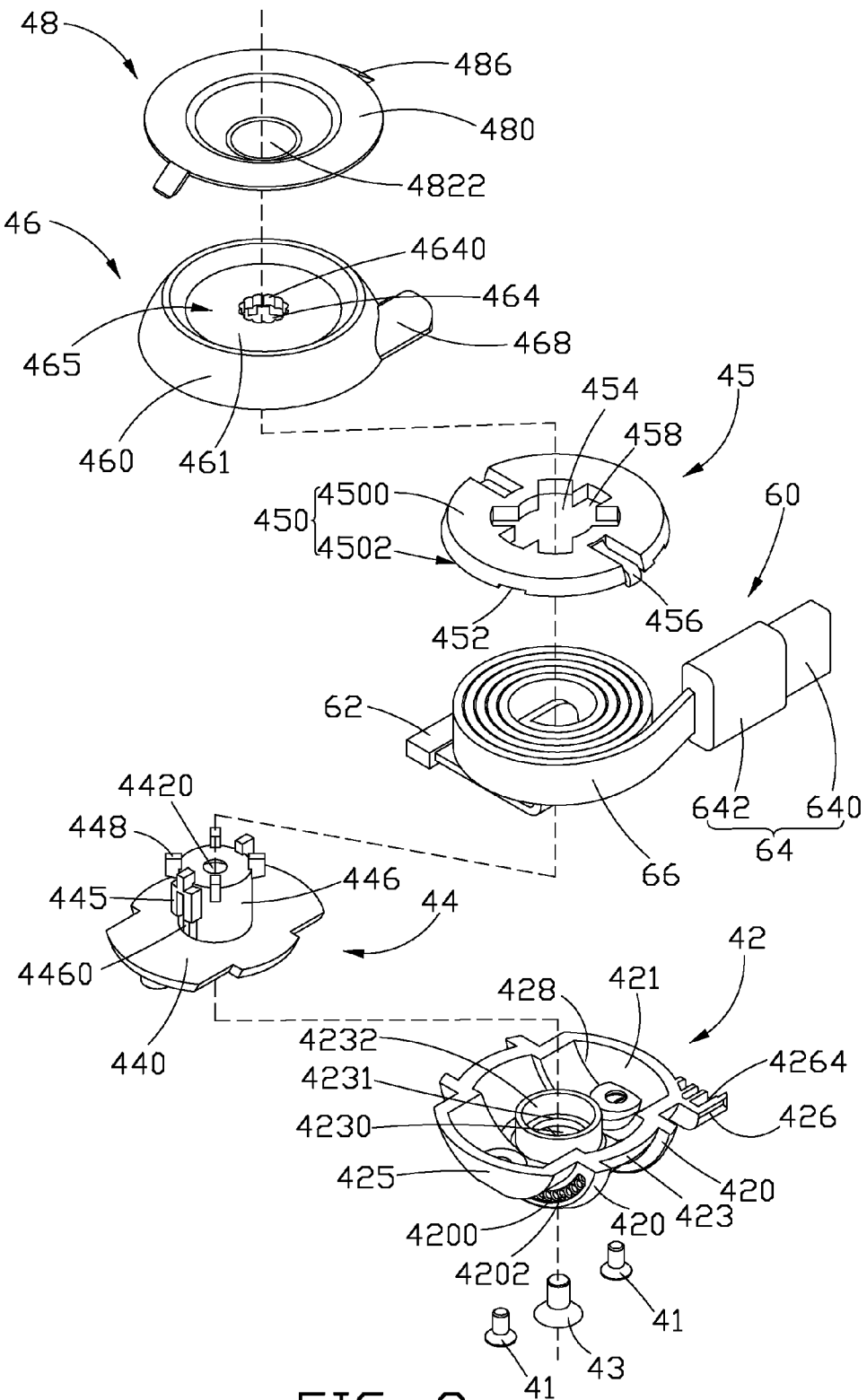
FIG. 9 is a disassembled perspective view of the seat portion in a second direction in accordance with the exemplary embodiment of the disclosure.

In FIGS. 7-9, the connecting cable 60 comprises a first connector 62, a second connector 64 and a cable portion 66 connected between the first connector 62 and the second connector 64. The first connector 62 is inserted into the main body 20 to engage with the connecting port 262 of the PCB 26. The second connector 64 comprises a joint portion 640 used to engage with a socket (not shown) of the peripheral equipment and a secure portion 642 located between the joint portion 640 and the cable portion 66 and used to fasten the joint portion 640 and the cable portion 66. The cable portion 66 is wound around the seat portion 40 which has functions of collecting cable and releasing cable.

Figure 11:
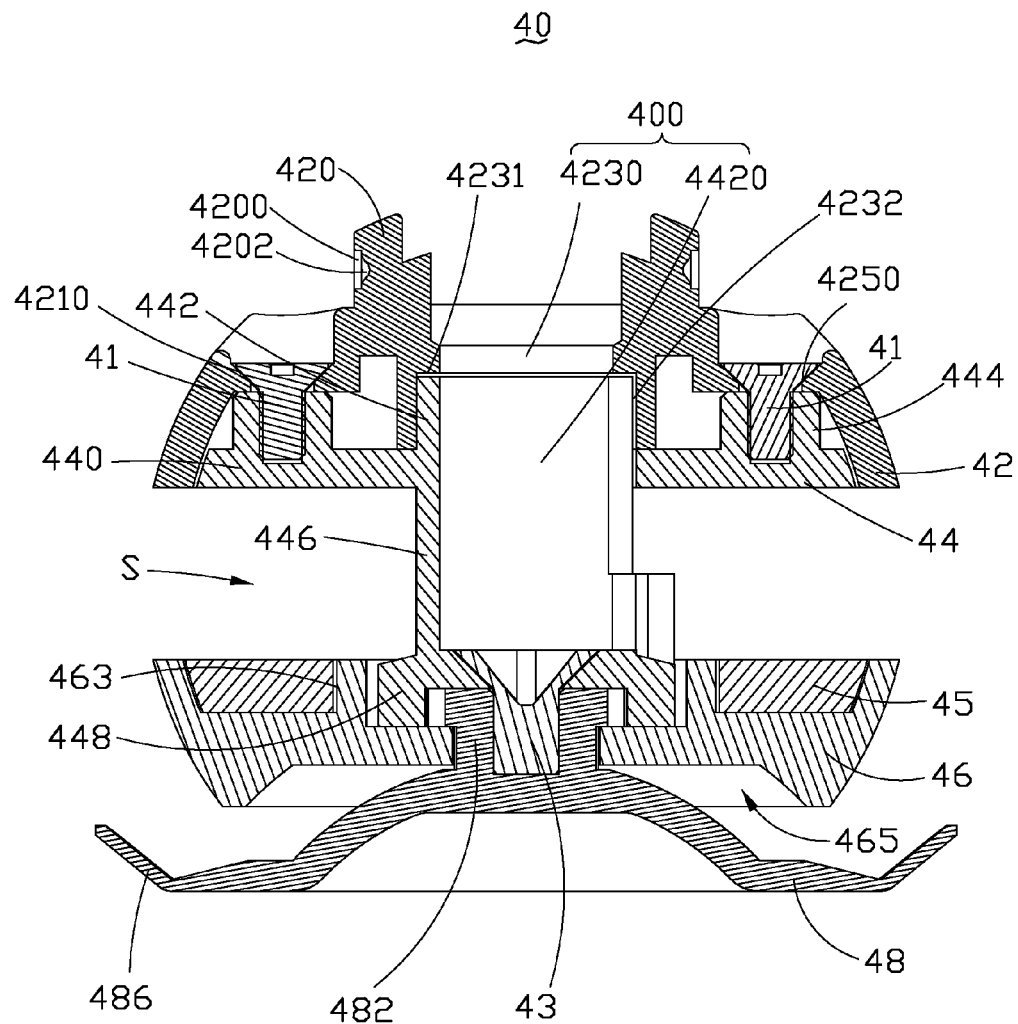
FIG. 11 is a cross-sectional view of the seat portion in the first direction, showing an installation state of the seat portion.
Figure 12:
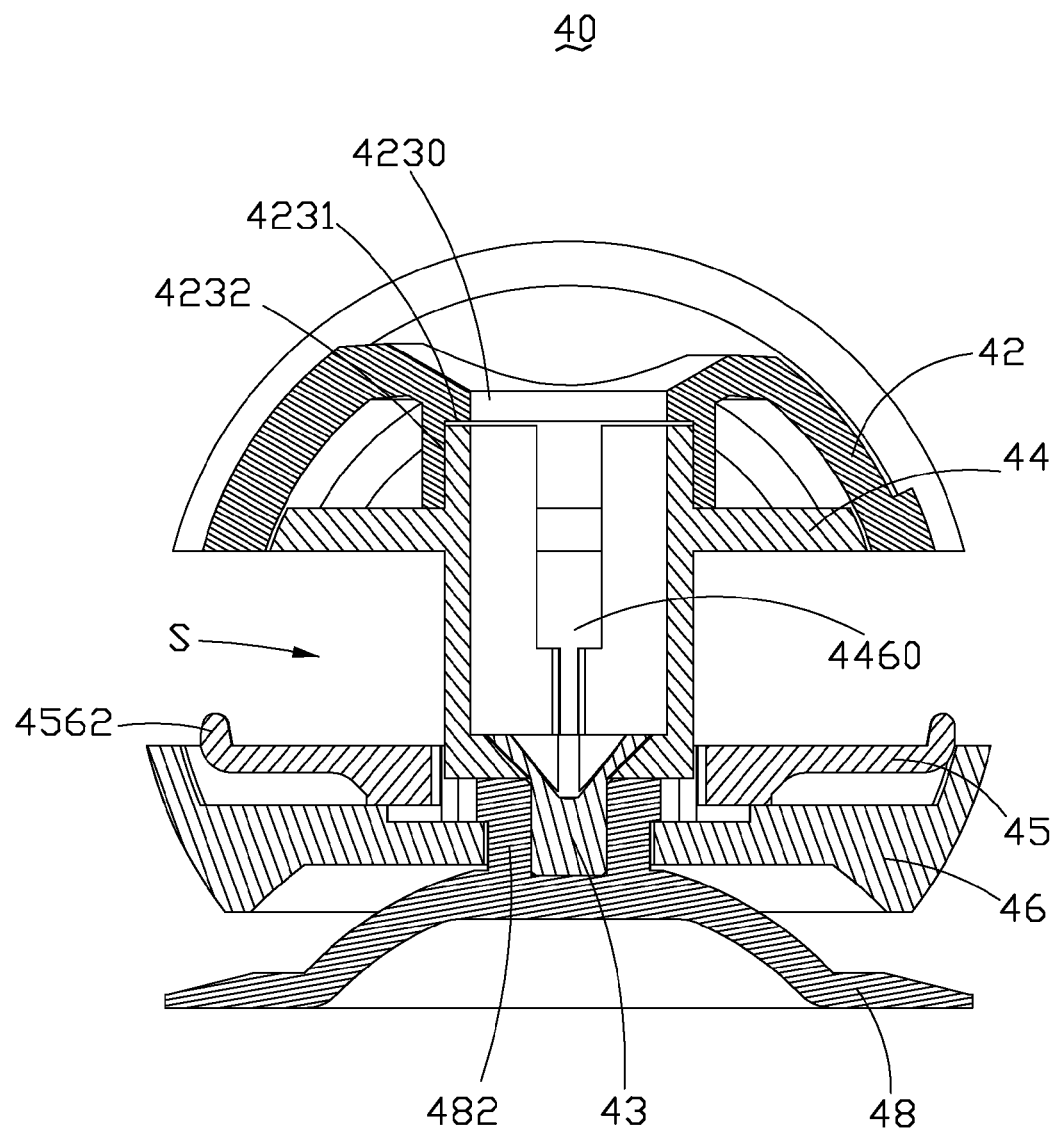
FIG. 12 is a cross-sectional view of the seat portion in the second direction, showing the installation state of the seat portion.

The seat portion 40 comprises a pair of guiding portions 420, used to slideably engage with the pair of sliding grooves 2460 of the sliding portion 246 of the main body 20, and a winding post 446, around which the cable portion 66 is wound. Referring to FIG. 11, the seat portion 40 defines a through hole 400 with an open end configured between the pair of guiding portions 420 and contiguous with the connecting hole 2440 of the main body 20 and a cable collecting space S communicating to the through hole 400. Referring to FIG. 12, the winding post 446 defines a gap 4460 communicating the through hole 400 to the cable collecting space S. In assembly, the first connector 62 is inserted into the main body 20 to engage with the connecting port 262. The cable portion 66 passes through the through hole 400 and the gap 4460 from the open end and wound on the winding post 446 and received in the cable collecting space S, shown in FIG. 13. The second connector 64 is exposed outside of the winding post 446.

Detailed structure of the seat portion 40 is described as follow.

The seat portion 40 comprises a first cover 42, a securing part 44, a central spacer 45, a second cover 46 and a base portion 48. The securing part 44, the central spacer 45 and the second cover 46 are installed between the first cover 42 connected to the main body 20 and the base portion 48 used to fix the electronic device 100 on placement surface. The pair of guiding portions 420 are formed as a part of the first cover 42. The winding post 446 is formed as a part of the securing part 44. Referring to FIG. 11, the first cover 42, the securing part 44, the central spacer 45 and the second cover 46 cooperatively define the cable collecting space S to receive the connecting cable 60. The through hole 400, the gap 4460 and the cable collecting space S cooperatively receive the cable portion 66 of the connecting cable 60.

In FIGS. 8-9, the first cover 42 comprises a first securing portion 421, a middle portion 423 and a second securing portion 425 cooperatively defining a receiving cavity 428. The middle portion 423 is located between the first securing portion 421 and the second securing portion 425. The pair of guiding portions 420 are respectively projected from junctions between the first securing portion 421 and the middle portion 423 and between the second securing portion 425 and the middle portion 423. Each of the guiding portions 420 defines a limiting groove 4200, in which a plurality of positioning notches 4202 evenly spaced apart from each other are defined. In assembly, the positioning protrusions 2466 of the pair of sliding grooves 2460 are positioned in the plurality of positioning notches 4202 of the pair of guiding portions 420 to position the main body 20 to the seat portion 40. The main body 20 is rotated relative to the seat portion 40 by movement between the sliding portions 246 and the guiding portions 420. The guiding portions 420 and the limiting grooves 4200 are arcuate shaped. The positioning protrusions 2466 selectively engage with different positioning notches 4202 to adjust a relative angle between the main body 20 and the seat portion 40.

The middle portion 423 defines a first through hole 4230 and a second through hole 4232 coaxial and communicating to the first through hole 4320. A step surface 4231 is configured between the first through hole 4230 and the second through hole 4232 and face the second through hole 4232. That is, a diameter of the second through hole 4232 is greater than that of the first through hole 4230. The first securing portion 421 defines a first securing hole 4210 extending from an outer surface exposed at exterior of the first securing portion 421 to the receiving cavity 428. The second securing portion 425 defines a second securing hole 4250 extending from an outer surface exposed at exterior of the second securing portion 425 to the receiving cavity 428.

Figure 10:
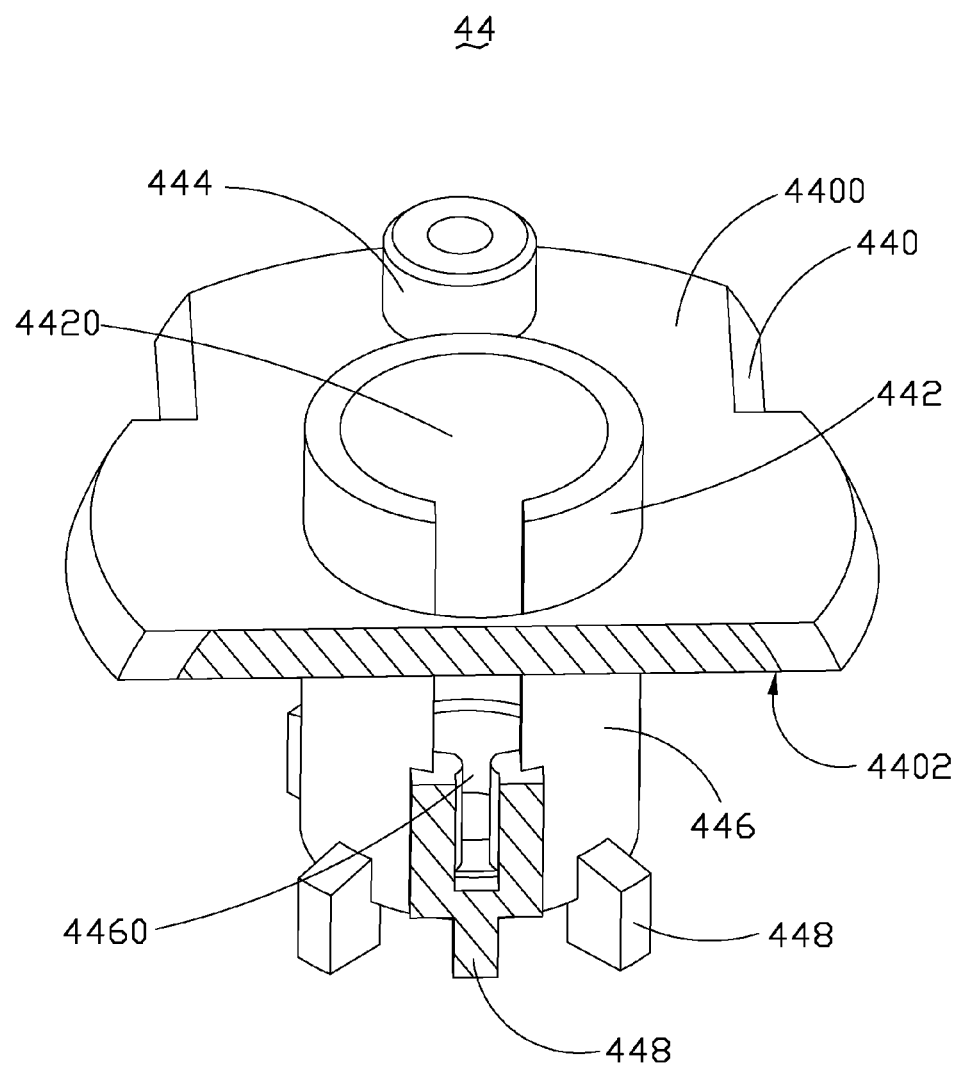
FIG. 10 is a partially cross-sectional view of a securing part of the electronic device in accordance with the exemplary embodiment of the disclosure.

Referring to FIG. 10, the securing part 44 comprises a positioning portion 440, an urging portion 442 and the winding post 446. The positioning portion 440 comprises a top surface 4400 and a bottom surface 4402. In assembly, the positioning portion 440 is received in the receiving cavity 428 of the first cover 42. The positioning portion 440 comprises a pair of fixing posts 444 protruding from the top surface 4400 and respectively opposite to the first securing hole 4210 and the second securing hole 4250. A pair of fasteners 41 respectively pass through the first securing hole 4210 and the second securing hole 4250 and are screwed into the pair of fixing posts 444 to fix the securing part 44 to the first cover 42. The urging portion 442 is projected from the top surface 4400 and located between the pair of fixing posts 444. The urging portion 442 is hollow and defines a third through hole 4420, through which the connecting cable 60 passes. In assembly, the urging portion 442 is received in the second through hole 4232 and touch the step surface 4231 (shown in FIG. 11), and the third through hole 4420 communicates with the first through hole 4230. The winding post 446 is hollow and projected from the bottom surface 4402 of the positioning portion 440. The third through hole 4420 extending into the winding post 446 and the first through hole 4230 cooperatively form the through hole 400 (shown in FIG. 11).

The securing part 44 further comprises one or more positioning blocks 448 protruding downwardly and outwardly from the winding post 446. The positioning blocks 448 are formed on bottom of the winding post 446 and used to engage with the second cover 46 to position the securing part 44 to the second cover 46. In this embodiment, the quantity of the positioning blocks 448 is six, and the positioning blocks 448 are symmetrically opposite to each other and disposed around the winding post 46 which is hollow cylinder shaped.

The second cover 46 comprises an enclosure portion 460 and a spacing portion 461 enclosed by the enclosure portion 460. The enclosure portion 460 and the spacing portion 461 cooperatively define a first receiving space 463 above the spacing portion 461 and a second receiving space 465 below the spacing portion 461. The first receiving space 463 is opened toward the first cover 42 and the securing part 44 and used to receive the central spacer 45. The second receiving space 465 is opened toward the base portion 48 and used to receive part of the base portion 48. The second cover 46 comprises a plurality of latching projections 462 inwardly protruding from the enclosure portion 460 and extending into the first receiving space 463. Accordingly, the central spacer 45 defines a plurality of latching notches 452 used to engage with the plurality of latching projections 462 to secure the central spacer 45 to the second cover 46. In this embodiment, the central spacer 45 is circular shaped, and the latching notches 452 are formed on outer edge of the central spacer 45.

The central spacer 45 defines a central hole 454 and one or more installing grooves 458 located around and communicating to the central hole 454. The second cover 46 defines a receiving hole 464 at central of the spacing portion 461. One or more engaging portions 466 having a same quantity with the at least one positioning block 448 protrudes from the spacing portion 461 to the first receiving space 463 and used to engage with the installing grooves 458 of the central spacer 45 and the positioning blocks 448 of the securing part 44. Each of the engaging portions 466 defines a latching open 4660 opened toward the receiving hole 464. In assembly, the central spacer 45 is mounted in the first receiving space 463 with engagement between the installing grooves 458 and the engaging portions 466 and engagements between the latching projections 462 and the latching notches 452. The winding post 446 passes through the central hole 454 of the central spacer 45 and is positioned into the latching open 4660 of the engaging portion 466 with engagement between the positioning block 448 and the latching open 4660.

The central spacer 45 further comprises a pair of elastic portions 456 located near the outer edge of the central spacer 45 and extending inwardly to the cable connecting space S to keep the connecting cable 60 in the cable connecting space S. Each of the pair of elastic portions 456 comprises an elastic arm 4560, a hook 4562 and a pair of clearance slots 4564. The clearance slots 4562 are respectively formed on two sides of the elastic arm 4560 to space the elastic arm 4560 from other parts of the central spacer 45 and provide elasticity of the elastic arm 4560. The hook 4562 is configured on a free end of the elastic arm 4560 and located on the outer edge of the central spacer 45. The hook 4562 protrudes toward the cable connecting space S to keep the connecting cable 60 in the cable connecting space S.

Figure 13:
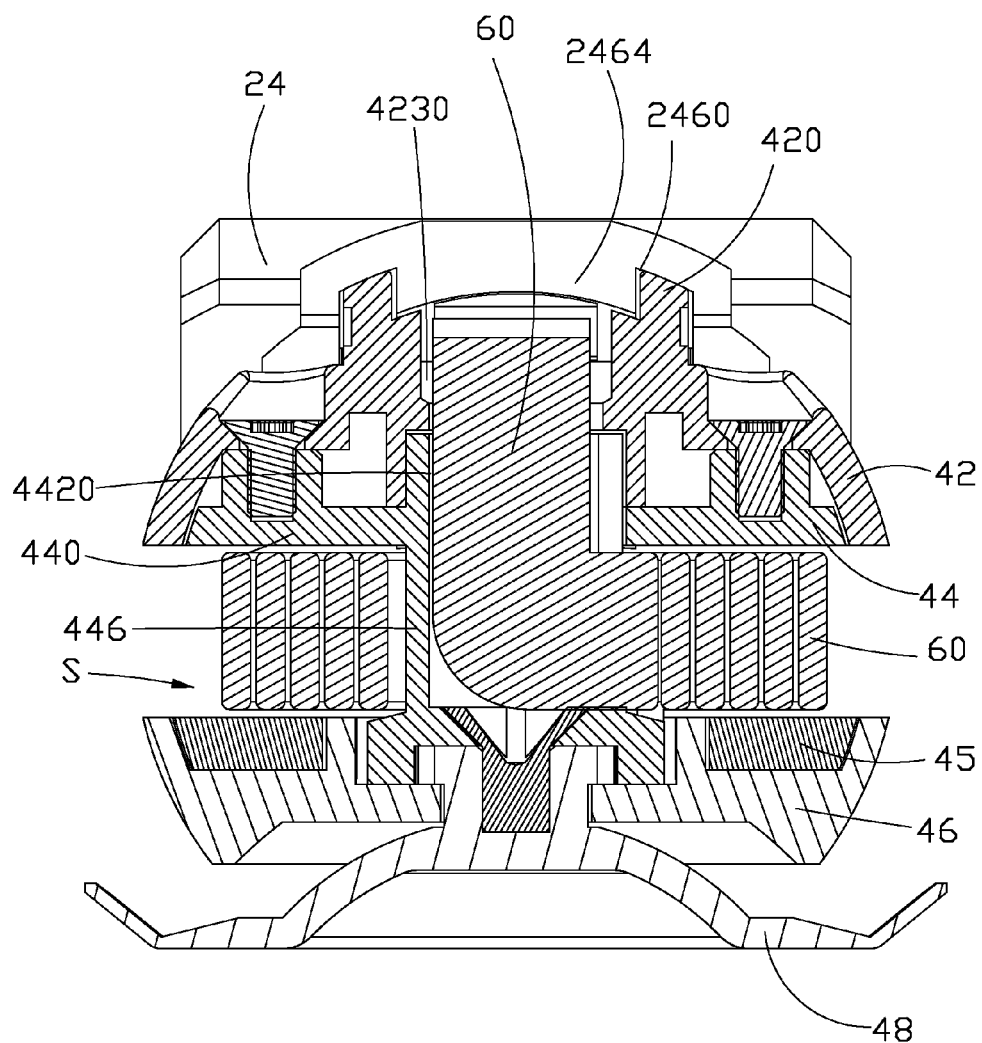
FIG. 13 is a cross-sectional view of the electronic device, showing the seat portion collecting a connecting cable.

The base portion 48 comprises a placing portion 480 and a connecting pole 482 defining a forth securing hole 4822. The connecting pole 482 protrudes from central of the placing portion 480 and is opposite to the receiving hole 464 of the second cover 46. Referring to FIGS. 11-13, in assembly, the connecting pole 482 passes through the receiving hole 464 and contacts with the winding post 446. A locking part 43 passes through the winding post 446 and is locked into the forth securing hole 4822 to fix the securing part 44 to the base portion 48. The connecting pole 482 of the base portion 48 comprises a plurality of arcuate protrusions 4820 configured on an outer surface of the connecting pole 482. Accordingly, the second cover 46 defines a plurality of inner grooves 4640 formed in the central of the spacing portion 461 and enclosing the receiving hole 464. In assembly, the plurality of arcuate protrusions 4820 engage with the plurality of inner grooves 4640 to prevent the second cover 46 from rotating relative to the base portion 48. The base portion 48 further comprises a pair of operating portions 486 extending from outer edge of the placing portion 480 and used for providing an operation of securing the electronic device 100 on or removing the electronic device 100 from the placement surface, such as a desktop, a window surface, an enclosure of a communication equipment or a touch screen of a communication equipment. In this embodiment, the placing portion 480 is configured as a suction cup used to adhere to the placement surface.

The first cover 42 further comprises a first cable guider 426 protruding from the first securing portion 421 outwardly. The second cover 46 further comprises a second cable guider 468 protruding from the enclosure 460 outwardly. The first and second securing portions 421, 468 are opposite to each other and extend away from the cable collecting space S. The first cable guider 426 and the second cable guider 468 cooperatively form a structure for guiding the connecting cable 60 to be pulled out from the cable collecting space S and for engaging with the secure portion 642 to secure the second connector 64 when the connecting cable 60 is entirely wound around the winding post 446. The first cable guider 426 comprises a first secure tab 4264 configured on a free end of the first cable guider 426 away from the first securing portion 421. The second cable guider 468 comprises a second secure tab 4684 configured on a free end of the second cable guider 468 away from the enclosure 460. The first secure tab 4264 and the second secure tab 4684 cooperatively engage with the secure portion 642 of the second connector 64 to secure the second connector 64 between the first cable guider 426 and the second cable guider 468, shown in FIG. 7 and FIG. 16.

Figure 14:
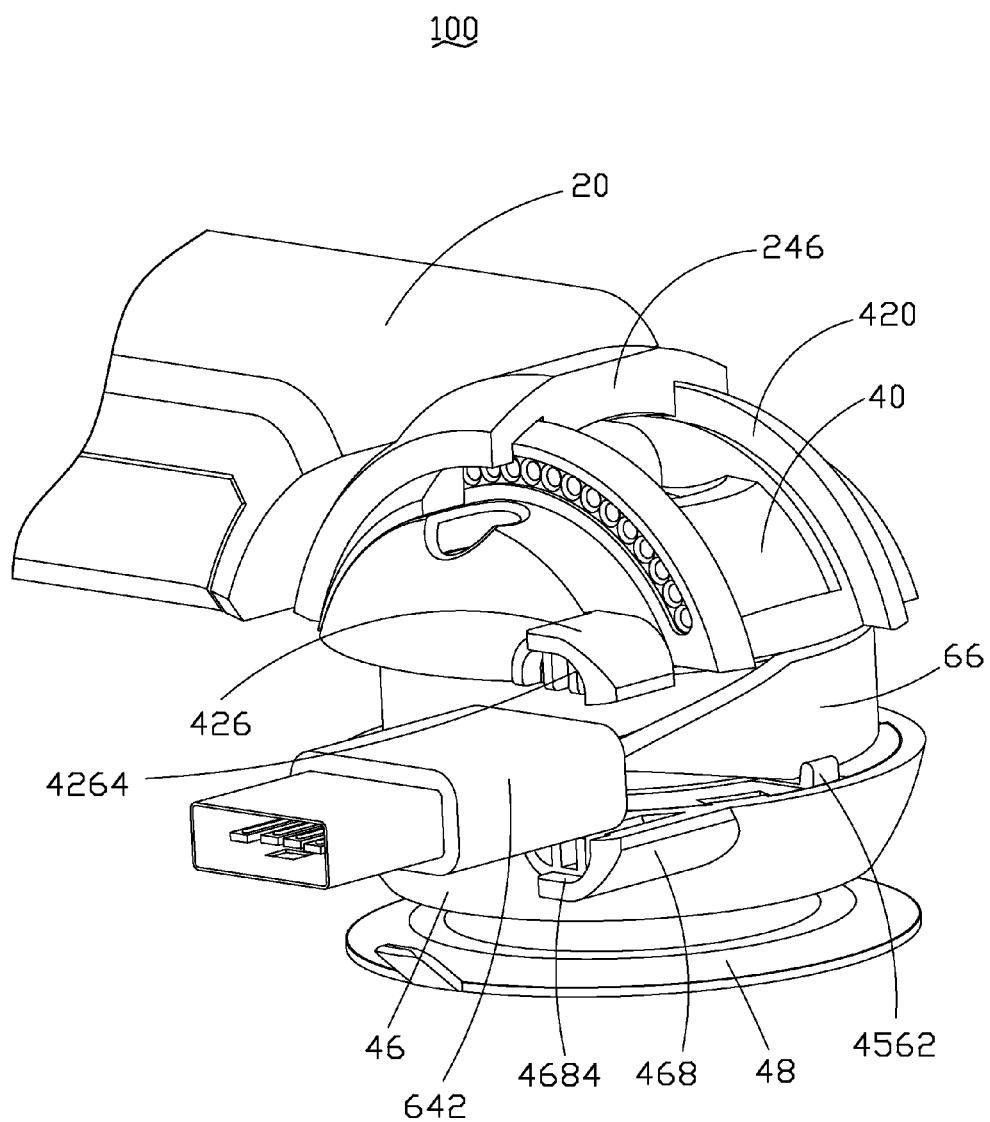
FIG. 14 is a perspective view of the first working condition of the electronic device shown in a cable collecting state.

FIG. 14 is a perspective view of a first working condition of the electronic device 100 shown in a cable collecting state. The sliding portions 246 of the main body 20 slide relatively to the guiding portions 420 of the seat portion 40 to a position away from the first cable guider 426. The cable portion 66 is entirely collected in the cable connecting space S of the seat portion 40, thereby the electronic device 100 being in the cable collecting state. The secure portion 642 of the second connector 64 fails to engage with the first secure tab 4264 and the second secure tab 4684.

Figure 15:
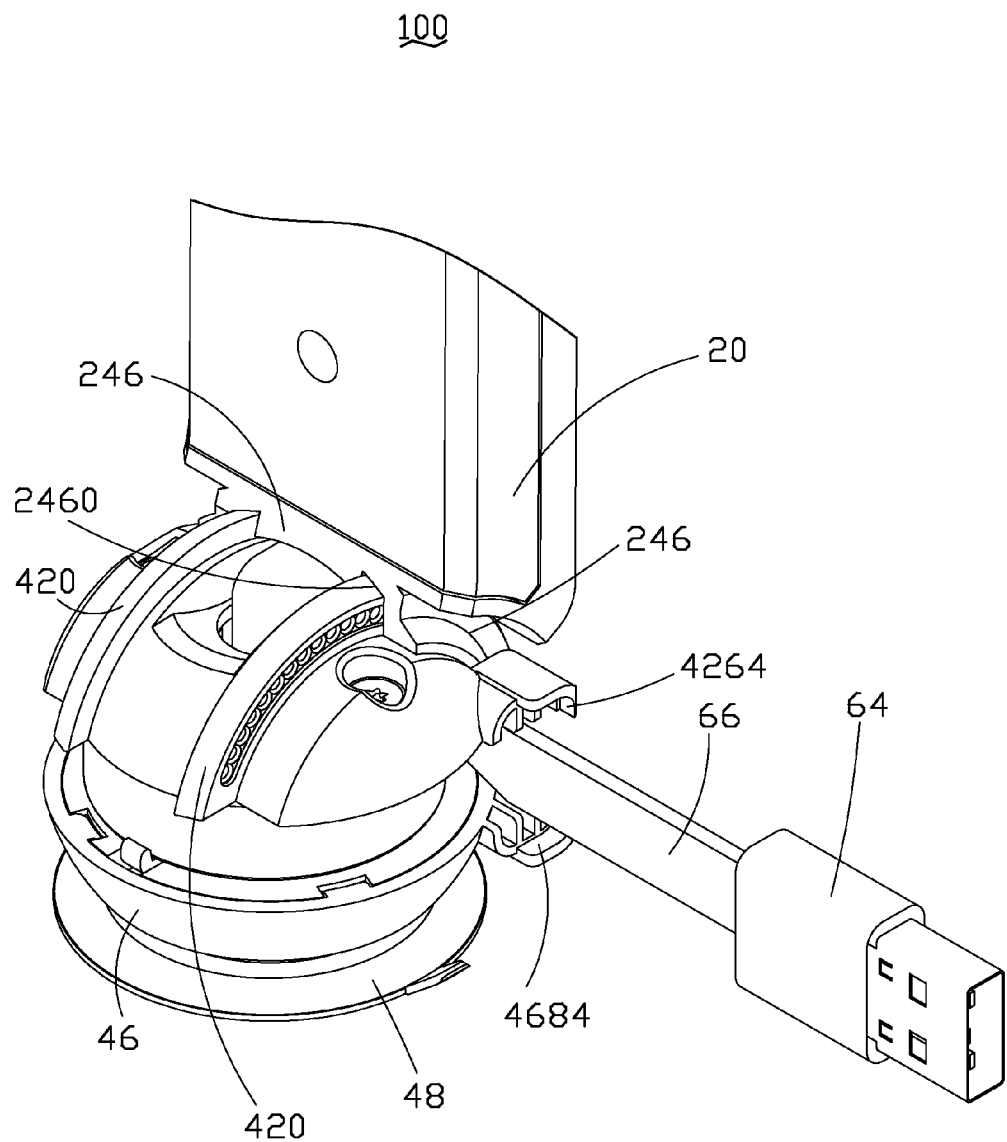
FIG. 15 is a perspective view of a second working condition of the electronic device shown in a cable discharging state.

FIG. 15 is a perspective view of a second working condition of the electronic device 100 shown in a cable discharging state. The sliding portions 246 of the main body 20 slide relatively to the guiding portions 420 of the seat portion 40 to a position close to the first cable guider 426. The cable portion 66 is partially pulled out from the cable connecting space S of the seat portion 40, thereby the electronic device 100 being in the cable discharging state.

Figure 16:
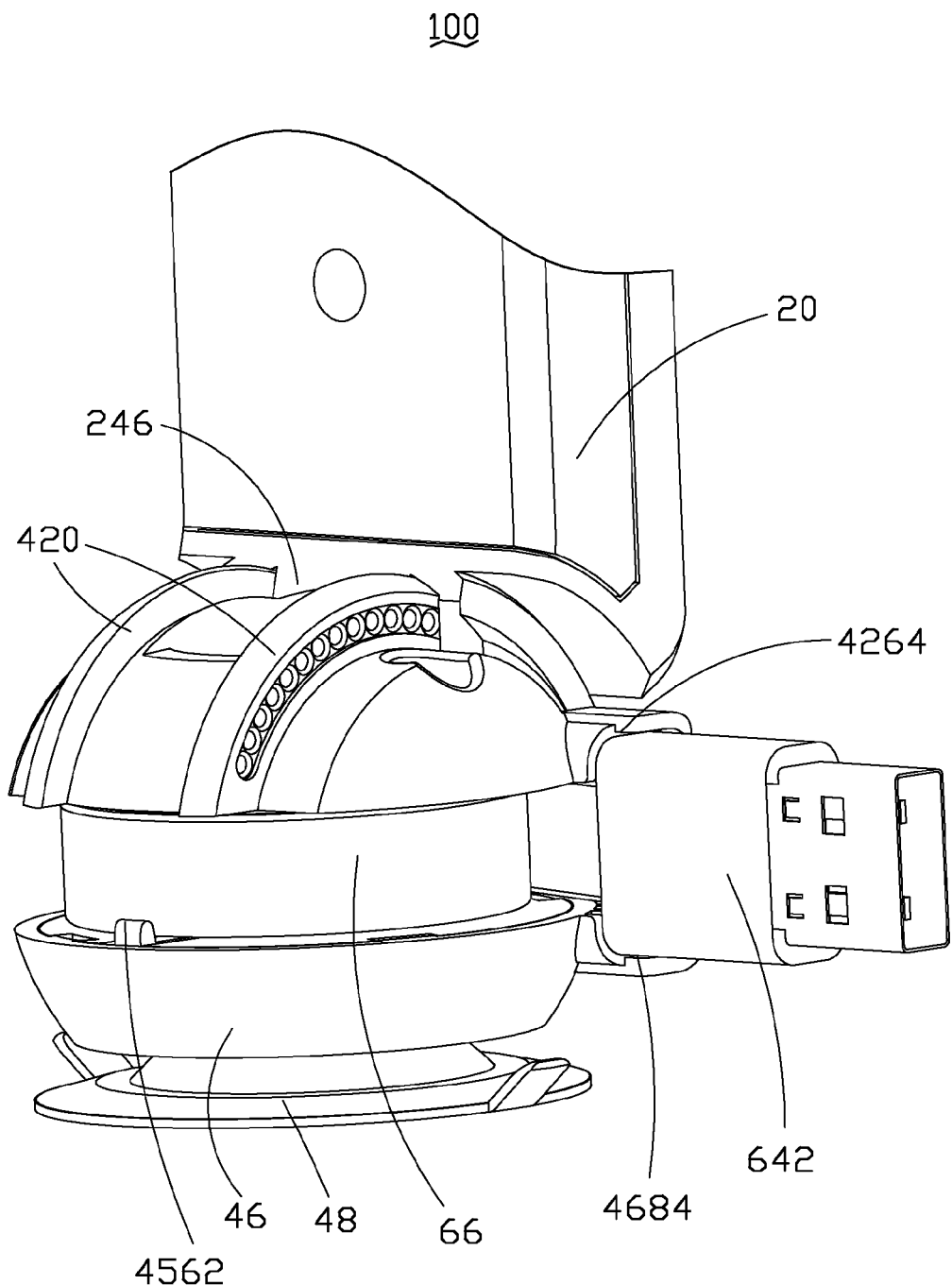
FIG. 16 is a perspective view of the second working condition of the electronic device, showing a connecting cable is collected in the seat portion.

FIG. 16 is a perspective view of the second working condition of the electronic device 100. The cable portion 66 is entirely collected in the cable connecting space S of the seat portion 40, and the secure portion 642 of the second connector 64 is fixed between the first secure tab 4264 and the second secure tab 4684.

In summary, the electronic device 100 of the disclosure communicates with the peripheral equipment by the connecting cable 60 which can be collected in or released from the seat portion 40. Moreover, the working angle of the main body 20 of the electronic device 100 can be adjusted by sliding the main body 20 relative to the seat portion 40 or reposition the base portion 48 to improve working efficiency of the electronic device 100.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:
1. An electronic device, comprising:
a main body, comprising a printed circuit board (PCB) comprising a connecting port and a sliding portion;
a seat portion, comprising a winding post, a cable connecting space formed around the winding post and a pair of elastic portions extending inwardly to the cable connecting space, which is hollow, the seat portion defining a through hole extending into the winding post and communicating with the main body, the winding post defining a gap communicating the through hole to a periphery of the winding post; and
a connecting cable, comprising a first connector inserted into the main body to engage with the connecting port of the PCB, a second connector exposed outside of the seat portion and a cable portion connected between the first connector and the second connector and received in the through hole and the gap to be latched with the pair of the elastic portions and enabled to be wound around the winding post and received in the cable connecting space;
wherein the seat portion slideably engages with the sliding portion to adjust an working angle of the electronic device, and the connecting cable is collected in or released from the seat portion by an external force pulling the second connector.

2. The electronic device as claimed in claim 1, wherein the sliding portion defines a pair of sliding grooves and comprising a plurality of positioning protrusions protruding inwardly into the pair of sliding grooves, the seat portion comprises a pair of guiding portions used to engage with the pair of sliding grooves, each of the pair of guiding portions defines a plurality of positioning notches, the main body is configured to be positioned in different angles relative to the seat portion via engagements between the positioning protrusions and the plurality of positioning notches.

3. The electronic device as claimed in claim 1, wherein the seat portion comprises a first cover comprising a pair of guiding portions used to engage with a pair of sliding grooves defined in the sliding portion of the main body and a second cover, the winding post is fixed between the first cover and the second cover, the first cover, the winding post and the second cover cooperatively define a cable collecting space, the through hole, the gap and the cable collecting space cooperatively receiving the cable portion of the connecting cable.

4. The electronic device as claimed in claim 3, wherein the main body defines a connecting hole surrounded by the sliding portion, and the through hole is configured between the pair of guiding portions and contiguous with the connecting hole.

5. The electronic device as claimed in claim 3, wherein the seat portion further comprises a central spacer secured to the second cover and the pair of elastic portions is located near the central spacer.

6. The electronic device as claimed in claim 5, wherein each of the pair of elastic portions comprises an elastic arm, a hook configured on a free end of the elastic arm and a pair of clearance slots respectively formed on two sides of the elastic arm to space the elastic arm from other parts of the central spacer, the hooks protrude toward the cable connecting space to keep the connecting cable in the cable connecting space.

7. The electronic device as claimed in claim 6, wherein the central spacer is circular shaped, the hooks are formed on an outer edge of the central spacer.

8. The electronic device as claimed in claim 3, wherein the first cover further comprises a first cable guider, the second cover further comprises a second cable guider, the first cable guider and the second cable guider are opposite to each other and extend away from the cable collecting space to cooperatively secure the second connector when the connecting cable is entirely wound around the winding post.

9. The electronic device as claimed in claim 3, wherein the seat portion further comprises a base portion comprising a placing portion and a connecting pole protruding from central of the placing portion, the connecting pole passes through the second cover and is fixed to the winding post, the connecting pole comprises a plurality of arcuate protrusions configured on an outer surface of the connecting pole, the second cover defines a receiving hole used to receive the connecting pole and a plurality of inner grooves enclosing the receiving hole, the plurality of arcuate protrusions engage with the plurality of inner grooves to prevent the second cover from rotating relative to the base portion.

10. An electronic device, comprising a main body, a seat portion and a connecting cable;
the main body comprising a printed circuit board (PCB) and movably connecting to the seat portion, the main body defining a connecting hole opposite to the seat portion;
the seat portion comprising a hollow winding post and defining a through hole extending into the winding post, the winding post defining a gap communicating the through hole with a periphery of the winding post, the seat portion comprising a cable connecting space formed around the winding post and a pair of elastic portions extending inwardly to the cable connecting space; and
the connecting cable comprising a first connector inserted into the main body to engage with the PCB, a second connector exposed outside of the seat portion and a cable portion connected between the first connector and the second connector and received in the connecting hole, the through hole and the gap to be latched with the pair of the elastic portions and enabled to be wounded around or released from the cable connecting space;
wherein the seat portion slideably engages with the sliding portion to adjust an working angle of the electronic device, and the connecting cable is collected in or released from the seat portion by an external force pulling the second connector.

11. The electronic device as claimed in claim 10, wherein the seat portion comprises a first cover slideably engaging with the main body and a second cover, the winding post is fixed between the first cover and the second cover, the first cover, the winding post and the second cover cooperatively define a cable collecting space, the cable portion of the connecting cable wound around the winding post is received in the cable collecting space.

12. The electronic device as claimed in claim 11, wherein the first cover further comprises a first cable guider, the second cover further comprises a second cable guider, the first cable guider and the second cable guider are opposite to each other and extend away from the cable collecting space to cooperatively secure the second connector when the connecting cable is entirely wound around the winding post.

13. The electronic device as claimed in claim 12, wherein the second connector comprises a joint portion and a secure portion located between the joint portion and the cable portion and used to fasten the joint portion and the cable portion, the first cable guider comprises a first securing tab configured on a free end of the first cable guider away from the cable collecting space, the second cable guider comprises a second secure tab opposite to the first securing tab, when cable portion is entirely collected in the cable connecting space, the secure portion is enabled to be fixed between the first secure tab and the second secure tab.

14. The electronic device as claimed in claim 11, wherein the seat portion further comprises a central spacer secured to the second cover and the pair of elastic portions is located near the central spacer.

15. The electronic device as claimed in claim 14, wherein each of the pair of elastic portions comprises an elastic arm, a hook configured on a free end of the elastic arm and a pair of clearance slots respectively formed on two sides of the elastic arm to space the elastic arm from other parts of the central spacer, the hooks protrude toward the cable connecting space to keep the connecting cable in the cable connecting space.

16. The electronic device as claimed in claim 15, wherein the central spacer is circular shaped, the hooks are formed on an outer edge of the central spacer.

17. The electronic device as claimed in claim 11, wherein the seat portion further comprises a base portion comprising a placing portion and a connecting pole protruding from central of the placing portion, the connecting pole passes through the second cover and is fixed to the winding post, the placing portion is configured as a suction cup.

\* \* \* \* \*